(12) United States Patent
Henderson et al.

(10) Patent No.: US 7,265,329 B2
(45) Date of Patent: Sep. 4, 2007

(54) IMAGE SENSORS WITH DISTRIBUTED AMPLIFIERS AND RELATED METHODS

(75) Inventors: Robert Henderson, Edinburgh (GB); Matthew Purcell, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 0 days.

(21) Appl. No.: 11/223,558

(22) Filed: Sep. 9, 2005

(65) Prior Publication Data

US 2006/0049334 A1     Mar. 9, 2006

(30) Foreign Application Priority Data

Sep. 9, 2004     (EP)    ................................. 04255476

(51) Int. Cl.
*H01L 37/00*     (2006.01)
*H03F 3/08*     (2006.01)
*H04N 3/14*     (2006.01)
*H03M 1/12*     (2006.01)

(52) U.S. Cl. .............................. 250/208.1; 250/214 A; 348/300; 341/155

(58) Field of Classification Search ............. 250/208.1, 250/214 A, 214 R; 348/300–304, 294, 307, 348/308; 257/290–292; 341/155
See application file for complete search history.

(56) References Cited

U.S. PATENT DOCUMENTS

| 5,801,657 | A | 9/1998 | Fowler et al. ............... 341/155 |
| 6,215,113 | B1 * | 4/2001 | Chen et al. ............... 250/208.1 |
| 6,310,571 | B1 | 10/2001 | Yang et al. ................. 341/155 |
| 6,369,737 | B1 | 4/2002 | Yang et al. ................. 341/155 |
| 6,380,880 | B1 | 4/2002 | Bidermann ................. 341/155 |
| 6,441,851 | B1 | 8/2002 | Yonemoto ................... 348/294 |
| 6,529,152 | B1 * | 3/2003 | Piasecki et al. ............ 341/144 |
| 6,545,624 | B2 * | 4/2003 | Lee et al. .................... 341/155 |
| 6,633,335 | B1 * | 10/2003 | Kwon et al. ................ 348/308 |
| 6,670,904 | B1 * | 12/2003 | Yakovlev .................... 341/167 |
| 6,693,575 | B1 | 2/2004 | Yang et al. ................. 341/155 |
| 2001/0005225 | A1 | 6/2001 | Clark et al. ................. 348/302 |
| 2004/0041927 | A1 | 3/2004 | Cho et al. ................... 348/254 |

FOREIGN PATENT DOCUMENTS

EP    1 391 932    2/2004

* cited by examiner

*Primary Examiner*—Thanh X. Luu
*Assistant Examiner*—Pascal M. Bui-Pho
(74) *Attorney, Agent, or Firm*—Lisa K. Jorgenson; Allen, Dyer, Doppelt, Milbrath & Gilchrist, P.A.

(57) ABSTRACT

The image sensor makes use of a distributed amplifier having its non-inverting input provided by a pixel amplifier transistor, and its inverting input and output provided in the pixel's column circuitry. The distributed amplifier is directly integrated with the image sensor's ADC circuit, and sampling and autozero are performed in a single step, thus reducing the number of noise contributions made by the components of the image sensor's readout chain.

21 Claims, 7 Drawing Sheets

IMAGE SENSORS WITH DISTRIBUTED AMPLIFIERS AND RELATED METHODS

FIELD OF THE INVENTION

According to a second aspect of the present invention, there is provided an integrated circuit comprising an image sensor which comprises pixel circuitry, readout circuitry and a distributed amplifier which comprises a first input residing in the pixel circuitry, and a second input and output residing in the readout circuitry, and wherein the second input is coupled to a ramp voltage generator and the output is coupled to an analog to digital converter (ADC) or conversion means. A switch or switch means is provided between the output and second input, and is selectively operable by an autozero signal. Features of the first aspect may also be applied to the second aspect.

BACKGROUND OF THE INVENTION

A typical solid-state image sensor comprises a light gathering stage and a readout chain. An example of such a sensor is described in S. K. Mendis, S. E. Kemeny, R. C. Gee, B. Pain, C. O. Staller, Q. Kim, E. R. Fossum, "CMOS active pixel sensors for highly integrated imaging systems", IEEE J. Solid-State Circuits, vol. 32, pp. 187-197, Feb. 1997. The light gathering stage comprises a photodiode or other type of light sensitive element and a charge to voltage conversion means, while the readout chain typically comprises a source follower (present for all active pixels), a sampling circuit, a preamplifier, and an analog to digital conversion circuit.

Each of these components introduces noise to the detected image. The light contains photon shot noise, the photodiode introduces dark current shot noise, and fixed pattern noise, and the charge to voltage conversion means introduces transfer gate noise (pinned-photodiode pixels) or reset noise (3T active pixels).

The readout chain attempts to convert the detected voltage to digital form with the minimum amount of additional noise. However, each component of the readout chain introduces noise to the process. The pixel source follower introduces both thermal and 1/f noise. The-pixel transistors must be small to achieve a small pixel size and high fill factor and this compromises the noise level achievable. This noise source is often dominant over the remaining circuit noise.

The sampling circuit is used to perform a double sampling step, using capacitors contained in the base of each pixel column. Two samples are taken and differenced to eliminate pixel source follower threshold (Vt) mismatch, which gives two contributions of kT/C noise. To achieve small chip sizes and fast readout times the size of the sampling capacitors is limited which therefore limits the minimum achievable noise level.

Next, the preamplifier introduces thermal and 1/f noise. Often some means of removing amplifier column offsets is applied (auto-zero or feedback) which tends to increase this noise. Finally, the analog to digital conversion circuit comprises a quantization element, or quantizer, that introduces additional thermal noise, and a ramp generator that contributes quantization noise and thermal noise. The quantization element is required to convert from analog to digital output levels and compare the input voltage levels with a ramp voltage.

When designing an image sensor circuit, it is also desirable to minimize the surface area on the image sensor substrate that the circuit occupies. There is therefore often a trade-off between noise reduction and size considerations, for example, when considering the size (or capacitance) of capacitors to be used. Excessive noise degrades the performance of an image sensor, while an excessively large circuit will limit the applications to which the image sensor can be put or be commercially unattractive. It is therefore desirable to have an image sensor that contributes less noise and that also makes efficient use of space.

SUMMARY OF THE INVENTION

According to a first aspect of the present invention, there is provided an image sensor comprising pixel circuitry, readout circuitry and a distributed amplifier which comprises a first input residing in the pixel circuitry, and a second input and output residing in the readout circuitry, and wherein the second input is coupled to a ramp voltage generator and the output is coupled to an analog to digital converter or conversion (ADC) means. A switch or switch means is provided between the output and second input, and is selectively operable by an autozero signal.

The first input may be a non-inverting input provided by a pixel amplifier transistor. The second input may be an inverting input that is coupled to the ramp generator via a column capacitor, and the switch means is selectively operable between a first state and a second state, wherein in the first state the switch causes the amplifier to be in closed loop operation and the offset of the amplifier is provided on the column capacitor. The closed loop operation may use a unity gain feedback.

Preferably, when the switch means is in the second state, the amplifier is in an open loop mode operation such that it acts as a comparator. The output may be coupled to a digital latch which is in communication with a memory or memory means. The ADC may be a single slope ADC. The image sensor may be a CMOS solid state image sensor. The pixel circuitry may comprise a photodiode, preferably a pinned photodiode. A pixel source follower, sampling circuit, amplifier and ADC may be integrated in a single circuit.

According to a second aspect of the present invention, there is provided an integrated circuit comprising an image sensor which comprises pixel circuitry, readout circuitry and a distributed amplifier which comprises a first input residing in the pixel circuitry, and a second input and output residing in the readout circuitry, and wherein the second input is coupled to a ramp voltage generator and the output is coupled to an analog to digital converter (ADC) or conversion means. A switch or switch means is provided between the output and second input, and id selectively operable by an autozero signal. Features of the first aspect may also be applied to the second aspect.

According to a third aspect of the present invention, there is provided a digital camera comprising an image sensor which comprises pixel circuitry, readout circuitry and a distributed amplifier which comprises a first input residing in the pixel circuitry, and a second input and output residing in the readout circuitry, and wherein the second input is coupled to a ramp voltage generator and the output is coupled to an analog to digital conversion (ADC) means. A switch or switch means is provided between the output and second input, the switch means being selectively operable by an autozero signal. Features of the first aspect may also be applied to the third aspect. The digital camera may be included in a mobile telephone, a webcam or an optical mouse, for example.

According to another aspect of the present invention, there is provided a method of sensing an image with an image sensor comprising pixel circuitry and readout circuitry, including the steps of providing a distributed amplifier comprising a first input residing in the pixel circuitry, and a second input and output residing in the readout circuitry, and coupling the second input to a ramp voltage generator. The method includes coupling the output to an analog to digital conversion (ADC) means, and selectively applying an autozero to operate a switch means provided between the output and second input.

The first input may be a non-inverting input provided by a pixel amplifier transistor. The second input may be an inverting input that is coupled to the ramp generator via a column capacitor, the method further comprising the steps of applying an autozero signal to put the switch means in a first state in which the amplifier operates in a closed loop mode of operation, and learning the offset of the amplifier on the column capacitor. The closed loop operation may use a unity gain feedback.

The method may further comprise the steps of switching off the autozero signal, and operating the amplifier in an open loop operation in which the amplifier acts as a comparator. The step of coupling the output to an analog to digital conversion (ADC) means may comprise coupling the output to a digital latch which is in communication with a memory means. The ADC may be a single slope ADC. The image sensor may be a CMOS solid state image sensor. The pixel circuitry may comprise a photodiode, preferably a pinned photodiode. A pixel source follower, sampling circuit, amplifier and ADC may all be integrated in a single circuit.

BRIEF DESCRIPTION OF THE DRAWINGS

The present invention will now be described, by way of example only, with reference to the accompanying drawings, in which.

DETAILED DESCRIPTION OF THE PREFERRED EMBODIMENTS

Figure 1:
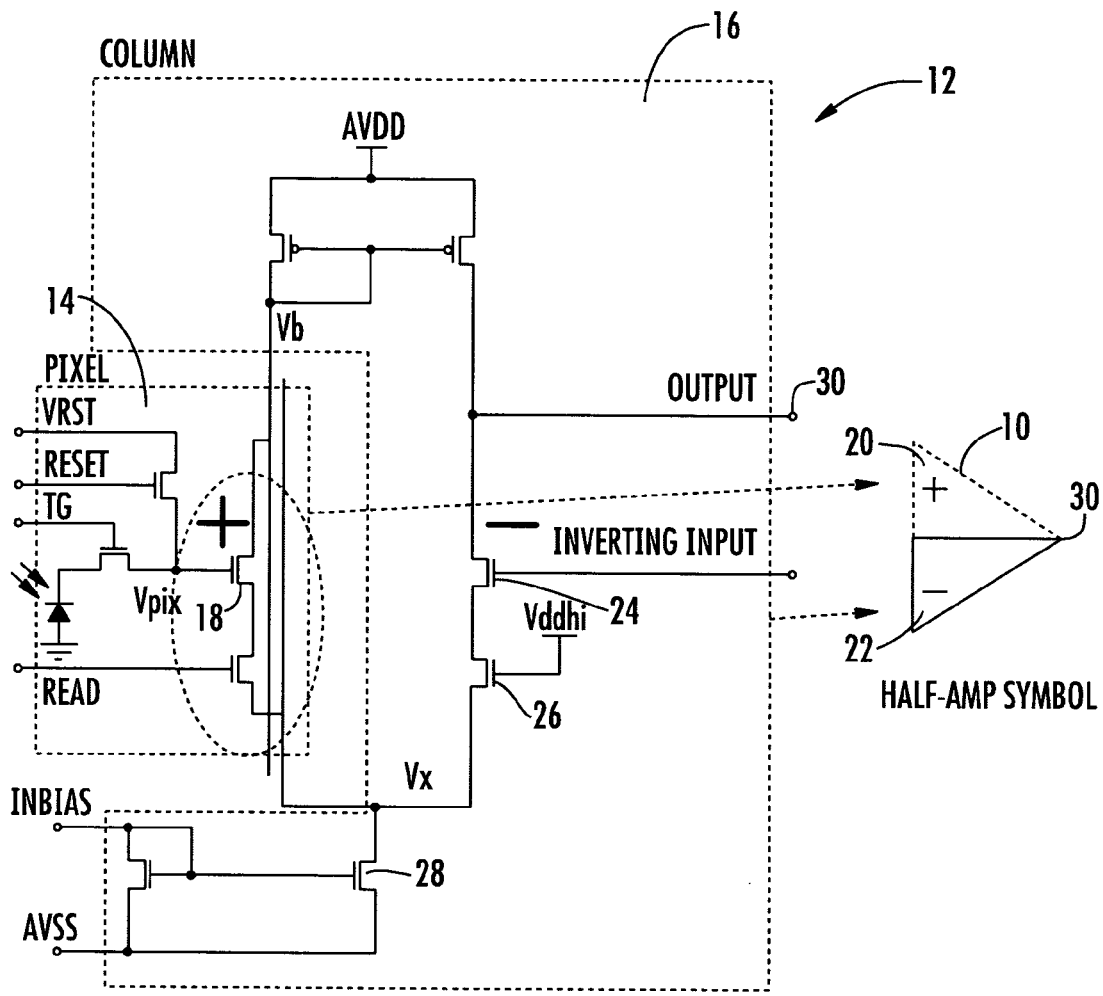
FIG. 1 is a schematic diagram illustrating a prior art distributed amplifier.

A known "distributed amplifier" 10 is shown in FIG. 1, the architecture of which is shown generally at 12. Such distributed amplifiers are known, for example from U.S. Pat. No. 6,130,423 assigned to Pixel Cam Inc., and U.S. Pat. No. 6,084,229 assigned to Photon Vision Systems LLC. Distributed amplifiers are currently used to linearize a pixel source follower and/or to attenuate reset noise of a three transistor pixel.

The present invention provides an image sensor in which all the components of the readout chain, that is the source follower (present for all active pixels), a sampling circuit, a preamplifier, and an analog to digital conversion circuit, are combined in one single circuit. In this circuit, the functions of these components can be described as being integrated. In particular, a distributed amplifier is provided which is integrated with an ADC for noise reduction. This is achieved by using a pixel amplifier as a column comparator.

The present invention pertains to image sensors formed from an array of active pixels. An active pixel may include a transfer gate, reset transistor and amplifying transistor, and may further optionally include a read transistor. The pixel has a photocurrent generating element which is preferably a photodiode, most preferably a pinned photodiode. In a pinned photodiode, the charge collection and charge to voltage conversion steps are separated. Charges are collected on a photodiode, and then transferred to a floating diffusion during readout. The invention is applicable to any type of image sensors formed from an array of active pixels, but has particular applicability for CMOS image sensors.

Referring again to FIG. 1, the architecture 12 shows some components of an exemplary pixel 14 and some of an exemplary column circuit 16, as outlined. The amplifier 10 uses the pixel's amplifier transistor 18 as its positive (non-inverting) input 20. The negative (inverting) input 22 is provided from a transistor 24 in the column circuitry, while the load and current source are formed from other transistors (26 and 28 respectively) also located in the column circuitry. The output 30 of the amplifier 10 is also shown.

Figure 2:
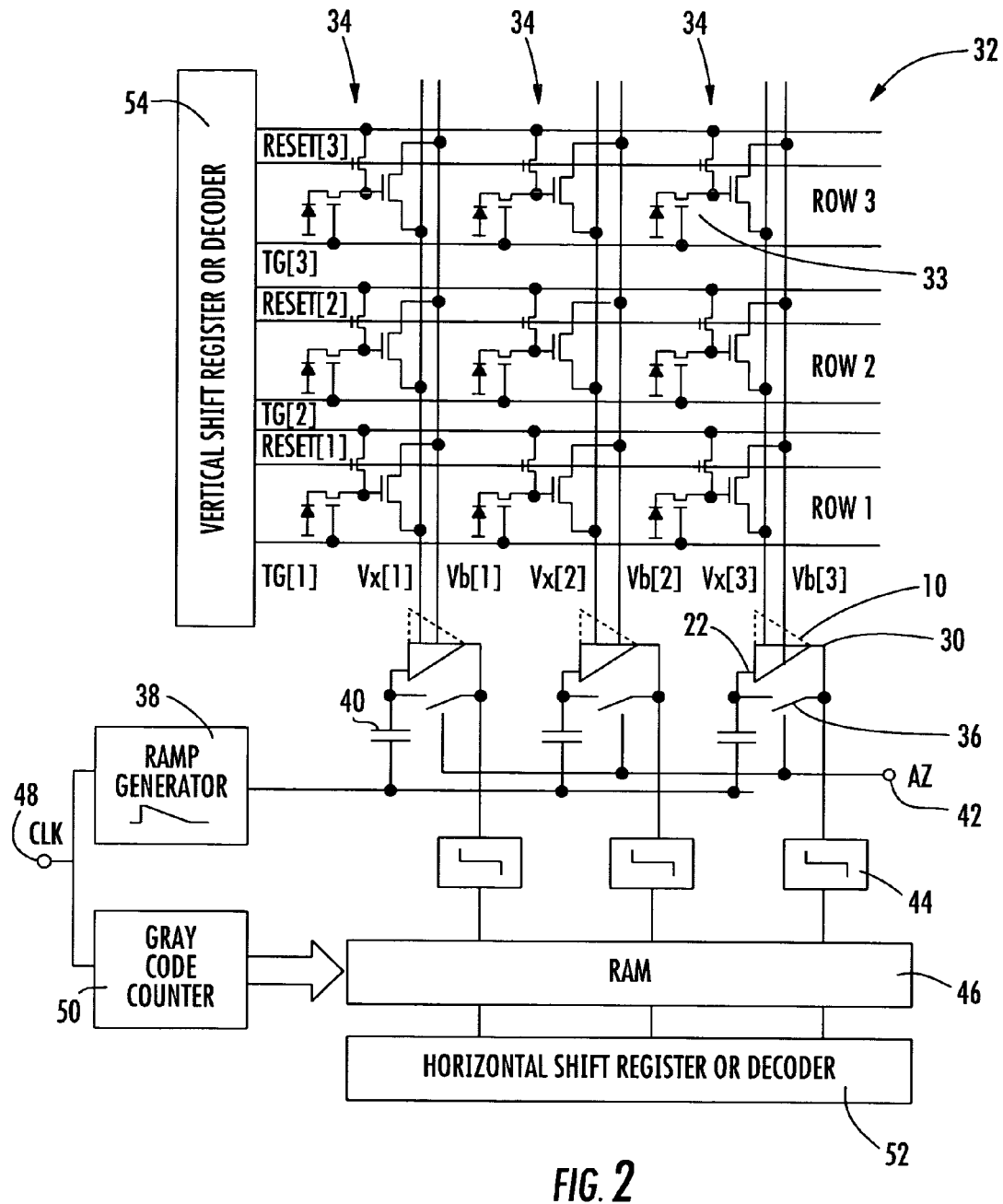
FIG. 2 is a schematic diagram illustrating part of an image sensor architecture according to a first embodiment of the invention, wherein a distributed amplifier is connected to an exemplary pixel array.

FIG. 2 shows a first embodiment of the invention, where a number of amplifiers 10 are connected to a pixel array 32 made up of individual pixels 33. The amplifiers 10 are connected to the output lines Vx(i) and Vb(i) of each column 34 of the pixel array 32. Each amplifier 10 has a reset switch 36 connected between its inverting input 22 and output 30 operated by a global auto-zero signal AZ 42. When the AZ signal 42, 66 goes high, the switch 36 is put into a first state whereby the amplifier is configured in unity gain feedback, and when the AZ signal 42, 66 goes low, the switch 36 is put into a second state whereby the amplifier is configured in open loop and acts as a high gain comparator. The ramp generator 38 voltage couples via a capacitor Ccol 40 to the inverting input of the amplifier. The output 30 of each amplifier 10 is connected to a digital latch 44 and an n-bit memory element 46.

The ramp voltage can be generated by any suitable means, such as a DAC. A clock 48 causes the analog ramp voltage to decrease and simultaneously a digital Gray Code Count (GCC) 50 to increment. The amplifier 10 output voltage is converted to a digital state by the latch on each rising edge of the clock. A transition in the latch 44 output state causes the state of the GCC 50 at that time to be memorized in the RAM 46. The memorized state in each column RAM 46 is a measure of the size of the pixel voltage. Readout of the RAM is controlled by a horizontal shift register or decoder 52.

Figure 3:
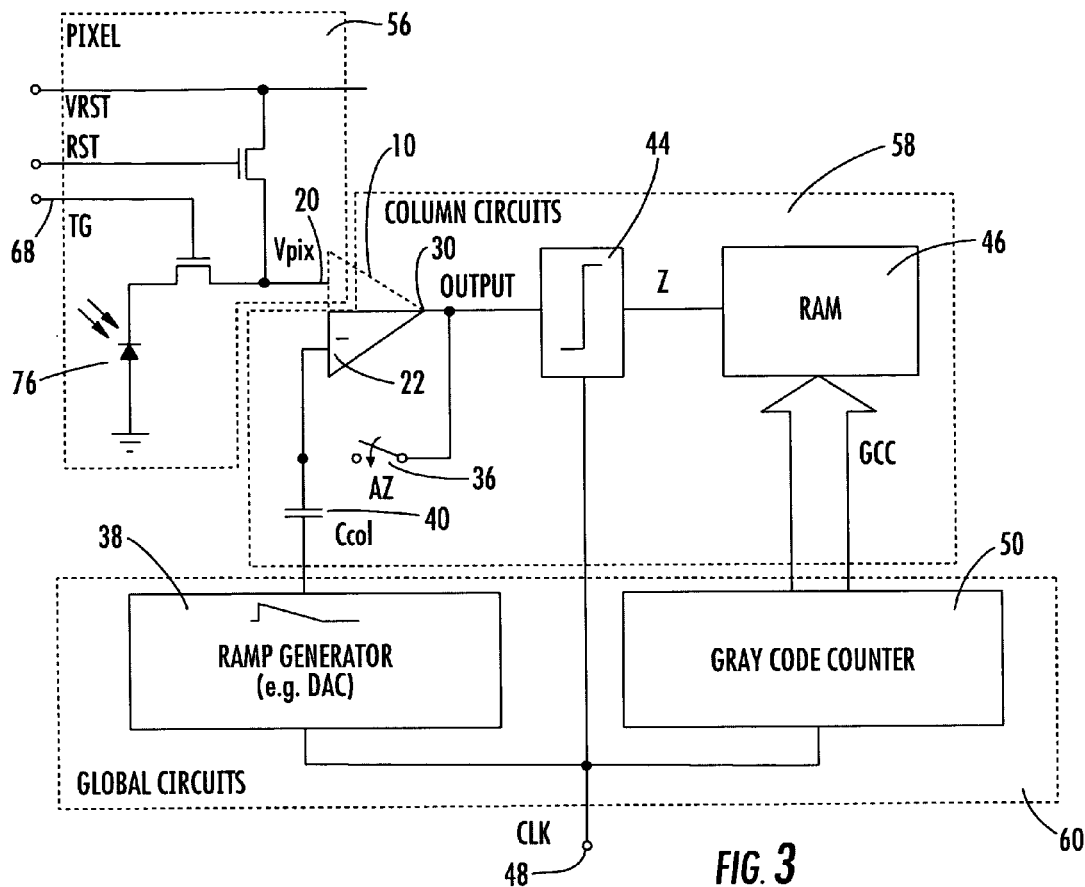
FIG. 3 is a schematic diagram illustrating details of a selection of components shown in FIG. 2.
Figure 4:
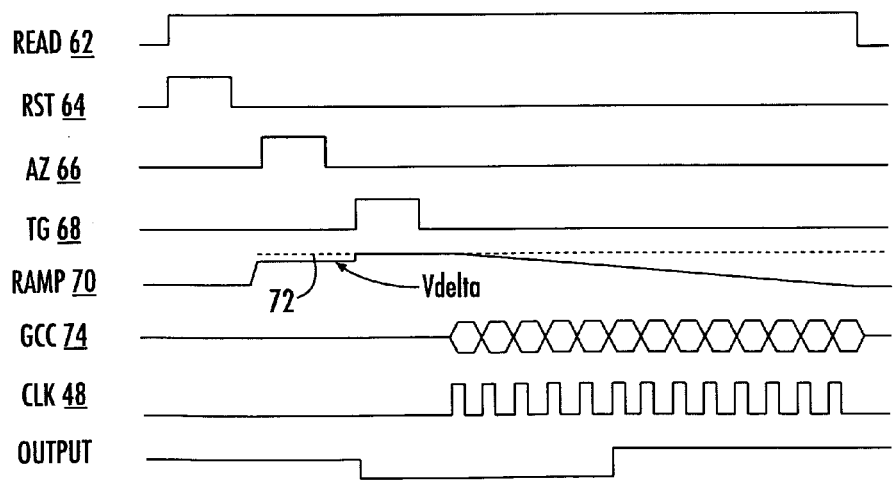
FIG. 4 is a signal timing diagram illustrating the operation of the components of FIG. 3.
Figure 5:
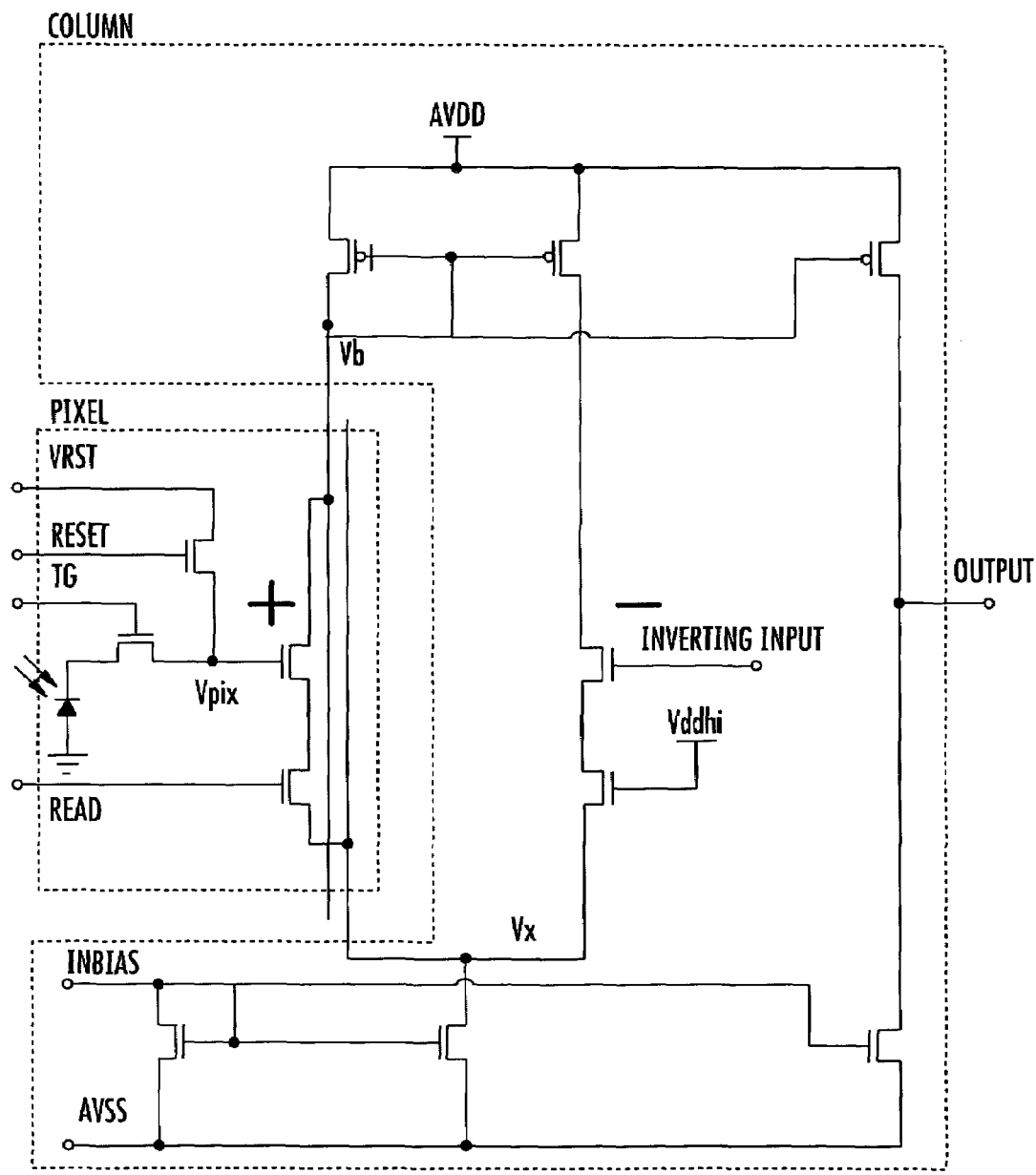
FIG. 5 is a schematic diagram illustrating an image sensor architecture according to a second embodiment of the invention, wherein a distributed amplifier is used to achieve a rail to rail output.

FIGS. 3 and 4 show the operation of a single column circuit of the array shown in FIG. 2. Labeled areas 56, 58 and 60 show which components are situated in the pixel, column circuits, and global circuits of the image sensor respectively. Components of FIG. 3 which correspond to those of FIG. 2 are illustrated with the same reference numerals.

A method of operation of the circuit of FIG. 3 will now be described. Firstly, a READ signal 62 for a particular row of the pixel array 32 is asserted. This allows current to flow through the pixel amplifier transistor 18 and the amplifier 10 feedback loop is active. Then a RESET line 64 for that row of pixels 33 is pulsed and the voltage Vpix on the floating diffusion sense node is reset to a voltage VRST. Charge coupling and kT/C noise injection cause this voltage to depart from VRST on the falling edge of RESET 64.

Next, an autozero (AZ) signal 66 is pulsed. The ramp voltage is at some high level from which it may descend to adequately cover the expected output voltage swing of the pixel 33. The high state of AZ 66 causes the amplifier 10 to be in unity gain feedback such that the offset of the amplifier 10 is provided on the column capacitor Ccol 40.

On the falling edge of AZ 66, the voltage on the capacitor Ccol 40 is $(VRST-Vch-(kT/Cfd)^{1/2}-Voffset-Vthermal)$, where Voffset is the amplifier 10 offset voltage (principally related to threshold (Vt) mismatch of the NMOS differential pair of the amplifier 10, Vch is the charge coupling, Vthermal is the sampled thermal noise level of the amplifier 10, and Cfd is the floating diffusion capacitance.

Then, with AZ in a low state, the amplifier 10 is in an open loop mode of operation. When the AZ 66 falls, a certain amount of kT/C noise is sampled on the capacitor Ccol 40. However the capacitor Ccol 40 is large compared to the floating diffusion capacitance and so this noise can effectively be disregarded. Next, the transfer gate TG is pulsed 68 for the row of pixels 33. Charge is transferred from the pixel photodiode to the floating diffusion sense node Vpix causing it to decrease by a voltage Vsig related to the amount of light integrated on the photodiode during exposure.

A goal of a pixel readout system is to convert this voltage to digital form with the minimum amount of additional noise due to the operation of the readout circuitry. At this point the ramp voltage 70 generated by the ramp voltage generator 38 can be increased by a fixed offset Vdelta 72 to ensure that the negative input is greater than the positive input. Since the amplifier 10 is now open-loop it acts as a high gain comparator. The output voltage of the amplifier goes to 0V in response to the negative voltage difference at the amplifier inputs.

The ramp now descends while a GCC 72 counts (the output 72 from the GCC 50 is illustrated in FIG. 4). The capacitor Ccol 40 causes the negative input of the amplifier 10 also to descend. When the negative input has moved by an amount (Vdelta+Vsig) the comparator output will change state (to AVDD) and the latch 44 will cause the GCC 72 value at this point to be stored in the RAM 46. During the descent of the ramp 70 the pixel floating diffusion may integrate a small amount of light. It is normally shielded from light with metal (not shown) to minimize this effect.

The capacitor noise sqrt(kT/Ccol) and Vthermal are not compensated by this scheme and so contribute to the noise floor of the converter. However, the amplifier offset voltage Voffset and sqrt(kT/Cfd) are determined and removed. Moreover, the input referred noise of a high gain comparator is very low and the ramp generator circuit noise may also be designed to make a minimal contribution. Thus, the noise contributed during actual ADC conversion is considered to be negligible compared to the noise during sampling. The noise contribution of the above described embodiments is reduced for the foregoing reasons.

As described above, a prior art image sensor has a separate source follower and amplification step, both of which contribute 1/f noise and thermal noise. However, the above described embodiment combines the source follower and preamplifier in one circuit, so there is only one such contribution of noise rather than two. The quantizer is created by configuring the original amplifier after sampling as an open loop comparator. The quantizer 1/f noise is thus determined and attenuated by the auto-zero step.

Also as described above, sampling and autozero are combined into one operation. This eliminates one contribution of sampling (kT/C) noise and an extra noise introduced during an auto-zero step, both of which are present in prior art sensors. Furthermore, this combination means that only one sampling capacitor is required where two have previously been required, which reduces the on-chip area of the circuit. The elimination of a separate column preamplifier also results in a space saving.

Figure 6:
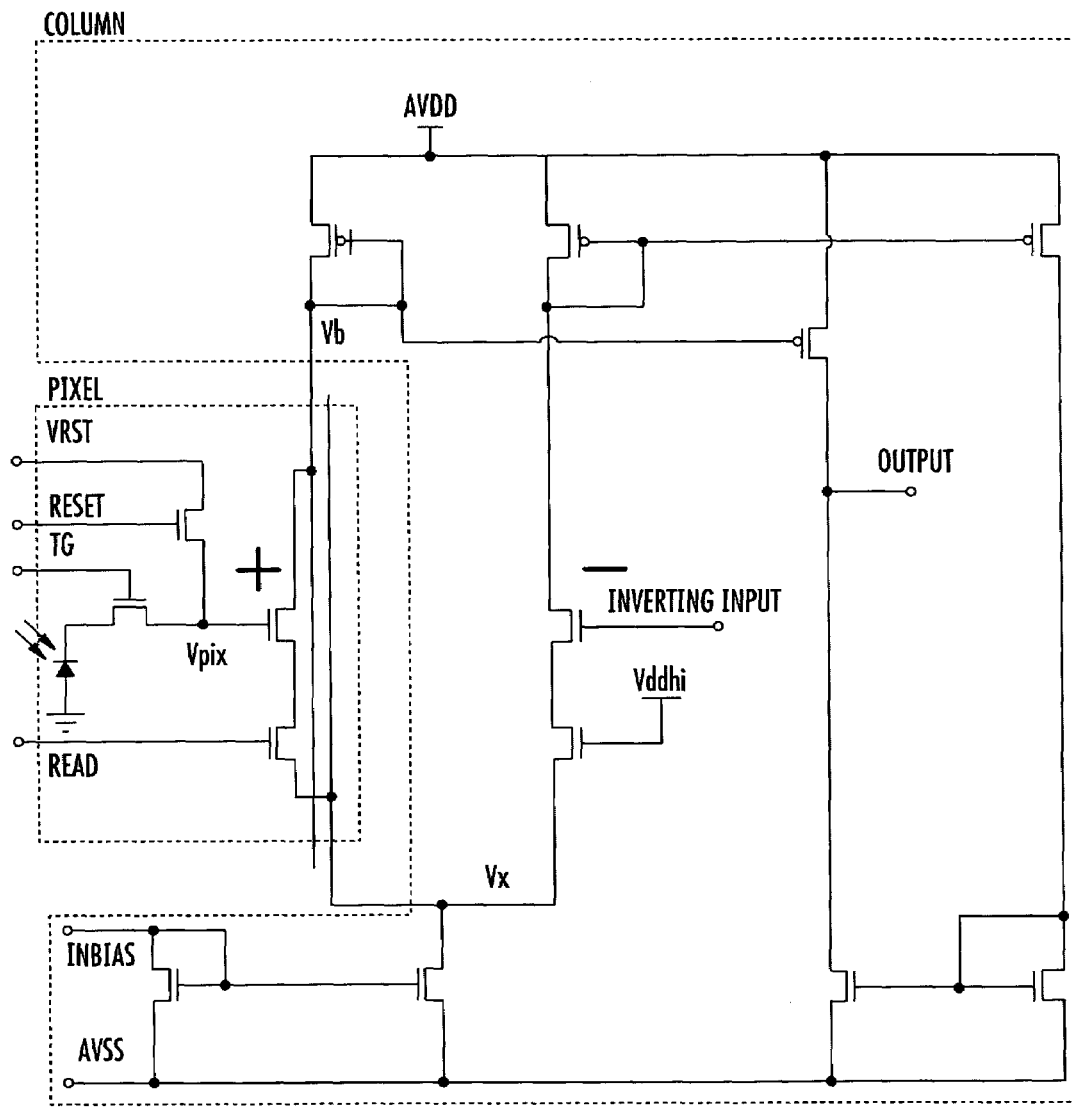
FIG. 6 is a schematic diagram illustrating an image sensor architecture according to a third embodiment of the invention, wherein a distributed amplifier is used to achieve an alternative rail to rail output.
Figure 7:
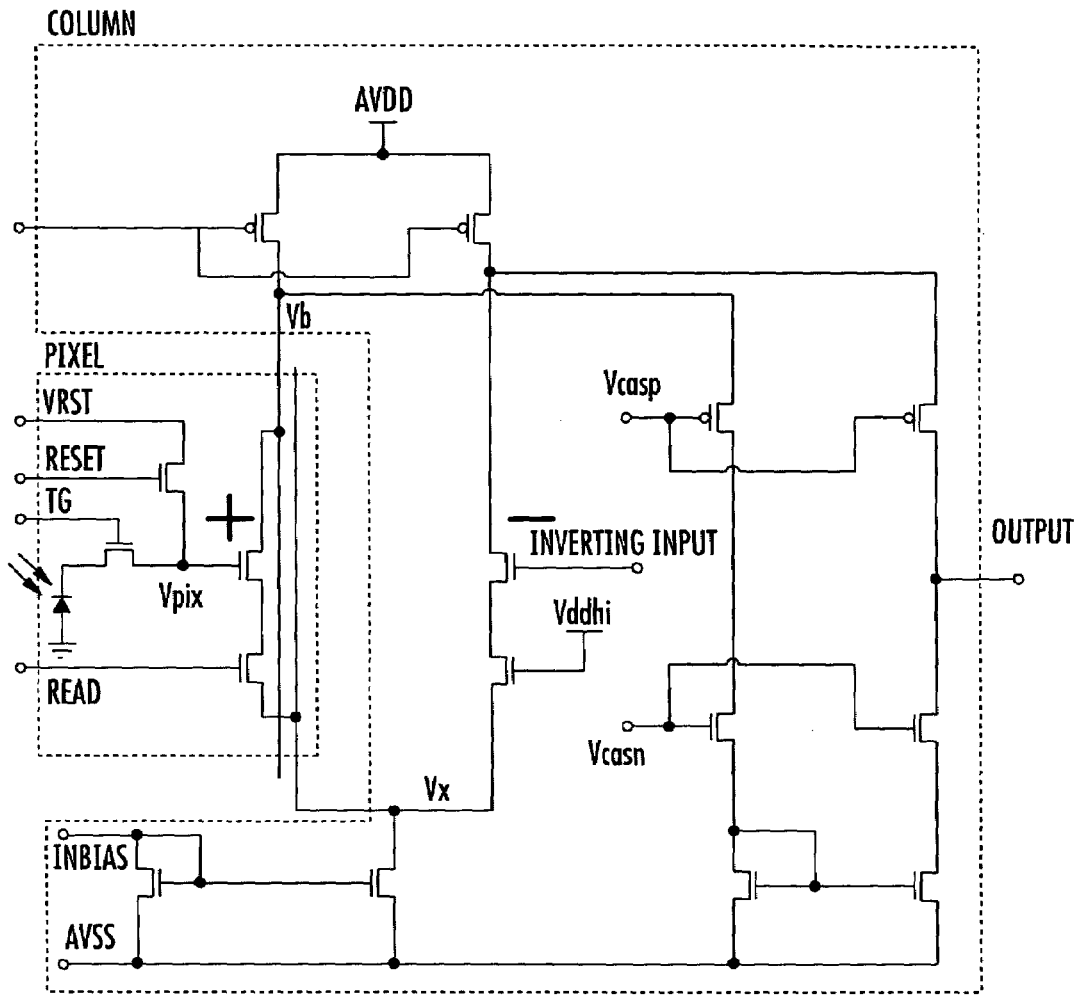
FIG. 7 is a schematic diagram illustrating an image sensor architecture according to a fourth embodiment of the invention, wherein a distributed amplifier is used to achieve a folded cascode circuit.
Figure 8:
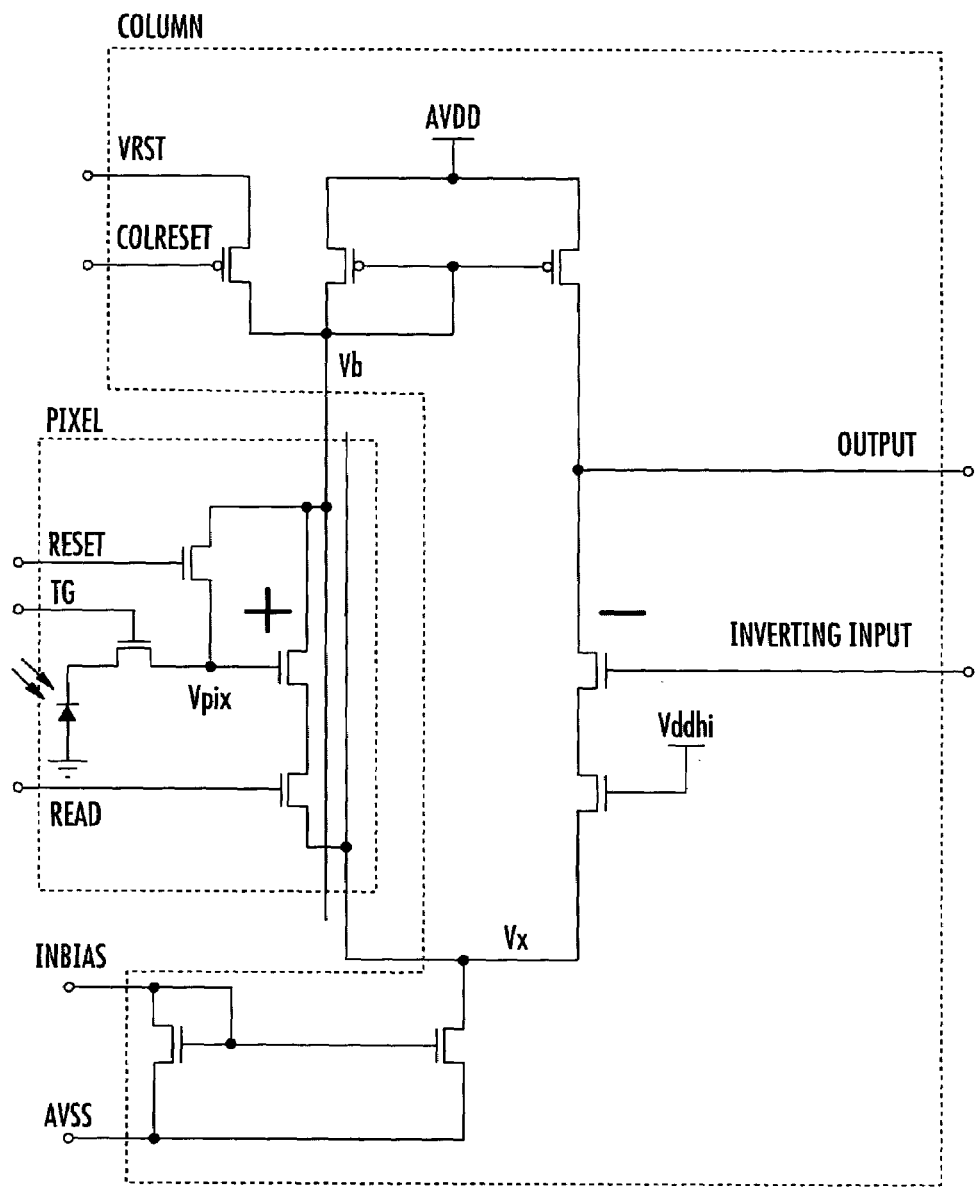
FIG. 8 is a schematic diagram illustrating an image sensor architecture according to a fifth embodiment of the invention, wherein a distributed amplifier is used with column-wise pixel reset voltage.

These and other advantages are also shown in alternative embodiments of the invention, some examples of which are shown in FIGS. 6-8. It will be appreciated that other amplifier configurations will be appreciated by those skilled in the art.

FIG. 6 shows another realization of a distributed amplifier employing a single stage operational transconductance amplifier structure. This amplifier produces a rail to rail output voltage range compatible with digital circuitry. FIG. 7 shows yet another implementation of a distributed amplifier using a folded cascode structure. This amplifier produces a rail to rail output voltage range compatible with digital circuitry. FIG. 8 shows a further implementation of a distributed amplifier, in which the Vb line is used to supply the pixel reset voltage. The ColReset signal goes low, overdriving the amplifier and setting Vb to VRST, the positive input can be set low during this time. Subsequent operation is unchanged from the system above.

Various modifications and improvements can be made to the above without departing from the scope of the present invention. For example, the above embodiments are described with reference to a single ramp ADC. However, the invention is equally applicable to a double or other multiple ramp ADC. The invention also has applicability to CMOS, CCD or other types of solid state image sensors, the pixel used in an image sensor of the invention could be any type of active or passive pixel, and can have any type of photocurrent generating element.

It will also be appreciated that the image sensor of the present invention can be incorporated into a number of different products, including but not limited to a digital camera, an optical mouse, mobile telephone or webcam incorporating the digital camera, or other more specialized imagers used in diverse fields. Those skilled in the art will appreciate that the practical matter of implementing the invention in any of these or other devices is straightforward, and thus will not be described herein in more detail.

That which is claimed is:

1. An image sensor comprising:
   pixel circuitry;
   readout circuitry;
   a distributed amplifier and an analog-to-digital conversion circuit (ADC) integrated therewith, said distributed amplifier comprising a first input provided within the pixel circuitry, and a second input and output provided within the readout circuitry;

the second input being connected to a ramp voltage, and the output being connected to a signal storage circuit; and a switch between the output and the second input, and being selectively operable by an autozero signal;

wherein the second input is connected to the ramp voltage via a column capacitor; and the switch is selectively operable between a first state and a second state, the first state of the switch causing the distributed amplifier to be in closed loop operation and the offset of the distributed amplifier to be provided on the column capacitor.

2. The image sensor of claim 1, wherein the first input comprises a non-inverting input including a pixel amplifier transistor.

3. The image sensor of claim 1, wherein the closed loop operation includes a unity gain feedback.

4. The image sensor of claim 1, wherein, when the switch is in the second state, the distributed amplifier is in an open loop mode operation and defines a comparator.

5. The image sensor of claim 1, wherein the signal storage circuit comprises a digital latch and a memory in communication therewith.

6. The image sensor of claim 1, wherein the ADC comprises a single slope ADC.

7. The image sensor of claim 1, wherein the image sensor comprises a CMOS solid state image sensor.

8. The image sensor of claim 1, wherein the pixel circuitry comprises at least one of a photodiode and a pinned photodiode.

9. The image sensor of claim 1, further comprising a pixel source follower and a sampling circuit, together defining an integrated circuit with the distributed amplifier and the ADC.

10. An integrated circuit comprising:
an image sensor including
pixel circuitry,
readout circuitry,
a distributed amplifier and an analog-to-digital conversion circuit (ADC) integrated therewith, said distributed amplifier comprising a first input provided within the pixel circuitry, and a second input and output provided within the readout circuitry,
the second input being connected to a ramp voltage, and the output being connected to a signal store circuit, and
a switch between the output and second input, and being selectively operable between an autozero signal;
wherein the second input is connected to the ramp voltage via a column capacitor and the switch is selectively operable between a first state and a second state, the first state of the switch causing the distributed amplifier to be in closed loop operation and the offset of the distributed amplifier to be provided on the column capacitor.

11. An imaging device comprising:
an image sensor including
pixel circuitry,
readout circuitry,
a distributed amplifier and an analog-to-digital conversion circuit (ADC) integrated therewith, said distributed amplifier comprising a first input provided within the pixel circuitry, and a second input and output provided within the readout circuitry,
the second input being connected to a ramp voltage, and the output being connected to a signal store circuit, and
a switch between the output and second input, and being selectively operable between an autozero signal;
wherein the second input is connected to the ramp voltage via a column capacitor and the switch is selectively operable between a first state and a second state, the first state of the switch causing the distributed amplifier to be in closed loop operation and the offset of the distributed amplifier to be provided on the column capacitor.

12. The imaging device of claim 11, wherein the imaging device comprises at least one of a digital camera, a mobile telephone including a digital camera, a webcam including a digital Camera, and an optical mouse including a digital camera.

13. A method of sensing an image with an image sensor comprising pixel circuitry and readout circuitry, the method comprising:
providing a distributed amplifier and an analog-to-digital conversion circuit (ADC) integrated therewith, wherein the distributed amplifier comprising a first input provided within the pixel circuitry, and a second input and output provided within the readout circuitry,
connecting the second input being connected to a ramp voltage;
connecting the output being connected to a signal store circuit; and
selectively applying an autozero signal to operate a switch provided between the output and second input;
wherein the second input is coupled to the ramp voltage via a column capacitor, the method further comprising:
applying the autozero signal to put the switch in a first state in which the distributed amplifier Operates in a closed loop mode of operation; and
determining the offset of the distributed amplifier via the column capacitor.

14. The method of claim 13, wherein the first input comprises a non-inverting input including a pixel amplifier transistor.

15. The method of claim 14, wherein the closed loop operation uses a unity gain feedback.

16. The method of claim 14, further comprising:
switching off the autozero signal, and
operating the distributed amplifier in an open loop operation in which the distributed amplifier defines a comparator.

17. The method of claim 14, wherein the step of connecting the output to the signal store circuit comprises connecting the output to a digital latch in communication with a memory.

18. The method of claim 14, wherein the ADC comprises a single slope ADC.

19. The method of claim 14, wherein the image sensor comprises a CMOS solid state image sensor.

20. The method of claim 14, wherein the pixel circuitry comprises at least one of a photodiode and a pinned photodiode.

21. The method of claim 14, wherein the image sensor further comprises a pixel source follower and a sampling circuit, together defining an integrated circuit with the distributed amplifier and the ADC.

* * * * *

UNITED STATES PATENT AND TRADEMARK OFFICE
CERTIFICATE OF CORRECTION

PATENT NO. : 7,265,329 B2
APPLICATION NO. : 11/223558
DATED : September 4, 2007
INVENTOR(S) : Henderson et al.

It is certified that error appears in the above-identified patent and that said Letters Patent is hereby corrected as shown below:

Column 1, Line 6   Delete: Entire paragraph from Lines 6-16 and
Insert: -- The present invention relates to the field of image sensors, in particular to an image sensor including pixel circuitry, readout circuitry and a distributed amplifier, and a method of sensing an image using the image sensor. --

Column 2, Line 49   Delete: "id"
Insert: -- is --

Column 8, Line 19   Delete: "Camera"
Insert: -- camera --

Column 8, Line 38   Delete: "Operates"
Insert: -- operate --

Signed and Sealed this

Twentieth Day of May, 2008

JON W. DUDAS
*Director of the United States Patent and Trademark Office*